(12) United States Patent
Wu et al.

(10) Patent No.: US 11,977,133 B2
(45) Date of Patent: May 7, 2024

(54) DEVICE AND METHOD FOR MEASURING MAGNETISM OF PERMANENT MAGNET MATERIAL AT HIGH TEMPERATURE

(71) Applicant: CHINA JILIANG UNIVERSITY, Hangzhou (CN)

(72) Inventors: Qiong Wu, Hangzhou (CN); Hangfu Yang, Hangzhou (CN); Hongliang Ge, Hangzhou (CN); Nengjun Yu, Hangzhou (CN); Minxiang Pan, Hangzhou (CN); Xiani Huang, Hangzhou (CN); Zisheng Wang, Hangzhou (CN)

(73) Assignee: CHINA JILIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/016,365

(22) PCT Filed: Apr. 16, 2021

(86) PCT No.: PCT/CN2021/087637
§ 371 (c)(1),
(2) Date: Jan. 16, 2023

(87) PCT Pub. No.: WO2022/213413
PCT Pub. Date: Oct. 13, 2022

(65) Prior Publication Data
US 2023/0273274 A1    Aug. 31, 2023

(30) Foreign Application Priority Data
Apr. 9, 2021  (CN) .......................... 202110384151.1

(51) Int. Cl.
*G01R 33/00* (2006.01)
*G01R 33/02* (2006.01)

(52) U.S. Cl.
CPC .......... *G01R 33/007* (2013.01); *G01R 33/02* (2013.01)

(58) Field of Classification Search
CPC .. G01R 33/007; G01R 33/02; G01R 33/1215; G01R 33/14; G01R 33/12
See application file for complete search history.

(56) References Cited

U.S. PATENT DOCUMENTS

2015/0130472 A1*  5/2015  Jun ........................ G01N 27/18
                                                    324/451
2018/0106685 A1*  4/2018  Lee ........................ H10N 10/01
(Continued)

FOREIGN PATENT DOCUMENTS

CN        2800290 Y    7/2006
CN      201051137 Y    4/2008
(Continued)

*Primary Examiner* — Alvaro E Fortich
(74) *Attorney, Agent, or Firm* — Bayramoglu Law Offices LLC

(57) ABSTRACT

A device for measuring magnetism of a permanent magnet material at a high temperature includes a laser device, a power controller, a light beam controller, a temperature controller, a magnetism measurement unit, temperature sensors, and electromagnet pole heads. The electromagnet pole heads are divided into an upper piece and a lower piece for clamping upper and lower surfaces of a sample. Heat absorbing sheets are respectively fixed on front and rear surfaces of the sample. Temperatures of the heat absorbing sheets are measured by the temperature sensors. The sample is heated by laser, and the temperature controller is used to adjust a ratio of light beams of the power controller and the light beam controller irradiating the heat absorbing sheets on the front and rear surfaces of the sample, thus adjusting the temperatures of the heat absorbing sheets. The magnetism of the sample is measured using the magnetism measurement unit.

10 Claims, 6 Drawing Sheets

(56) References Cited

U.S. PATENT DOCUMENTS

2020/0005974 A1* 1/2020 Liu .................. H01F 7/021
2020/0194152 A1* 6/2020 Liu .................. H01F 7/02

FOREIGN PATENT DOCUMENTS

| CN | 202362442 U | 8/2012 |
| CN | 105158328 A | 12/2015 |
| CN | 107044995 A | 8/2017 |
| CN | 109782201 A | 5/2019 |
| JP | 2008039736 A | 2/2008 |
| WO | 2005040842 A1 | 5/2005 |

* cited by examiner

DEVICE AND METHOD FOR MEASURING MAGNETISM OF PERMANENT MAGNET MATERIAL AT HIGH TEMPERATURE

CROSS REFERENCE TO THE RELATED APPLICATIONS

This application is the national phase entry of International Application No. PCT/CN2021/087637, filed on Apr. 16, 2021, which is based upon and claims priority to Chinese Application No. 202110384151.1, filed Apr. 9, 2021, the entire contents of which are incorporated herein by reference.

TECHNICAL FIELD

The present invention belongs to the field of magnetism measurement, and particularly relates to a device and method for measuring the magnetism of a permanent magnet material at a high temperature.

BACKGROUND

With the development of science and technology, there is an increasingly high requirement for the working performance of a permanent magnet. Especially in the space field and high-performance power equipment, the permanent magnet is required to work under a high-temperature condition and have good magnetic performance. However, there are still certain defects in the measurement of the magnetic performance of permanent magnet materials under the high-temperature condition.

Existing measurement methods for a high-temperature magnet mainly include open-circuit measurement and closed-circuit measurement. In the open-circuit measurement method, measurement equipment such as a VSM (vibrating sample magnetometer) and a PPMS (physical property measurement system), which have a higher requirement for experimental equipment. In the other method, a BH tester is used. A heating sheet is additionally arranged at a top of an electromagnet pole head of the BH tester, so that a sample is heated through the heating sheet, and the magnetic performance of the permanent magnet material at a high temperature is measured in a closed-circuit mode. However, this heating method has the following defects: First, the heating temperature usually does not exceed 200° C. under the heating limit of a resistance wire or a heating sheet. Second, the use of a heating current in the heating sheet will generate a stray magnetic field, which will affect measurement results. Third, the heating efficiency is low, and the time required is long.

SUMMARY

The present invention aims to provide a device and method for measuring the magnetism of a permanent magnet material at a high temperature, so as to solve the technical problems of low heating speed for magnets, low energy and impact on measurement results.

In order to solve the above technical problems, specific technical schemes of a device and method for measuring the magnetism of a permanent magnet material at a high temperature are as follows:

Provided is a device for measuring the magnetism of a permanent magnet material at a high temperature, which includes a laser device, a power controller, a light beam controller, a temperature controller, a magnetism measurement unit, temperature sensors, and electromagnet pole heads, wherein the electromagnet pole heads are divided into an upper piece and a lower piece which are respectively used for clamping upper and lower surfaces of a sample; heat absorbing sheets are respectively fixed on front and rear surfaces of the sample;

the temperature sensors are arranged on the heat absorbing sheets and are used for measuring temperatures of the heat absorbing sheets;

the magnetism measurement unit is respectively connected with a magnetic field measurement probe and a magnetic induction intensity measurement coil and is used for recording and calculating the magnetism of the sample; the magnetic field measurement probe is arranged on a side surface of the sample, and the magnetic induction intensity measurement coil is arranged at a bottom of the sample;

the laser device emits a laser beam, and the laser beam is divided into two laser beams by the light beam controller to irradiate the front and rear surfaces of the sample to heat the sample; and the temperature controller is respectively connected with the light beam controller, the power controller and the heat absorbing sheets, and adjusts a ratio of light beams of the light beam controller and the power controller irradiating the heat absorbing sheets on the front and rear surfaces of the sample, thus adjusting the temperatures of the heat absorbing sheets.

Furthermore, each heat absorbing sheet is made of a high-temperature-resistant heat conduction material with a thickness of 1 mm to 5 mm, and preferably a surface of the heat absorbing sheet is coated with a heat absorbing film having a consistent wavelength with that of laser; and the heat absorbing sheets are fixed on the front and rear surfaces of the sample by clamps.

Furthermore, the heat absorbing sheets are fixed on the surfaces of the sample through high-temperature heat conduction glue.

Furthermore, a heat isolation sheet is arranged between each electromagnet pole head and the sample.

Furthermore, the power controller is an adjustable electric light filter with light filtering efficiency of 0.1%-100%, preferably an electric light filter rotating wheel; the light beam controller is an adjustable light beam controller composed of a reflector and a light filter, and a reflected light beam is adjustable within 1%-100%; an operating temperature of each temperature sensor is 0° C.-900° C., and the temperature sensors are arranged inside or on surfaces of the heat absorbing sheets.

Furthermore, the sample has a length, a width and a height of a, b and c respectively, wherein the height c has a value of $5\ mm \leq c \leq 20\ mm$; and the length and the width have values of $5\ mm \leq a \leq 10\ mm$ and $5\ mm \leq b \leq 10\ mm$ respectively.

The present invention further discloses a method for measuring the magnetism of a permanent magnet material, which includes the following steps:

step I: magnetizing the square block permanent magnet sample to a saturated state;

step II: respectively fixing the two heat absorbing sheets on the front and rear surfaces of the sample and placing between the two electromagnet pole heads, and a distance between the electromagnet pole heads is adjusted to enable the two electromagnet pole heads to compress the sample;

step III: emitting, by the laser device, a laser beam, wherein the laser beam is divided into two laser beams through the power controller and the light beam controller, enabling the two laser beams to respectively irradiate the heat absorbing sheets on the front and rear surfaces of the sample, and measuring and obtaining temperatures $T_1$ and $T_2$ of the heat absorbing sheets on the front and rear surfaces of the sample through the temperature sensors on the heat absorbing sheets;

step IV: using the temperature controller to adjust, according to the temperatures of the heat absorbing sheets obtained in step III, the power controller and the light beam controller to enable the temperatures $T_1$ and $T_2$ of the heat absorbing sheets to gradually approach $T_0$ to finally achieve $T_1=T_2=T_0$, and starting to measure the magnetism of the sample after the temperature is stabilized for a period of time;

step V: making a magnetizing current to the electromagnet such that the sample is magnetized to a saturated state; decreasing the magnetizing current, changing a direction of the magnetizing current, and increasing the magnetizing current such that a demagnetization curve passes through a coercive force point or an intrinsic coercive force point; measuring, by the magnetic field measurement probe, a magnetic field intensity of the electromagnet in the whole process, and measuring, by the magnetic induction intensity measurement coil, a magnetic induction intensity of the sample in the whole process; and step VI: recording and calculating, by the magnetism measurement unit, a demagnetization curve, a maximum BH product, remanence, coercive force and intrinsic coercive force of the sample at temperature $T_0$.

Furthermore, a height of a magnetic field magnetizing the sample in step I is 1 to 5 times the height c of the sample.

Furthermore, the laser device in step III is a femtosecond pulse laser device or a continuous laser device.

Furthermore, $T_1$ and $T_2$ in step IV are controlled to be $T_0 \pm 2°$ C.; a temperature range of $T_0$ is $50°$ C.$\leq T_0 \leq 700°$ C.; and a waiting time is 15 min to 60 min.

The device and method for measuring the magnetism of a permanent magnet material at a high temperature of the present invention have the following advantages: by the adoption of a laser heating mode, the heating speed is high, and the energy is high; the magnetism of the permanent magnet material under a high-temperature condition can be effectively measured, and measurement results will not be affected.

Figure 1:
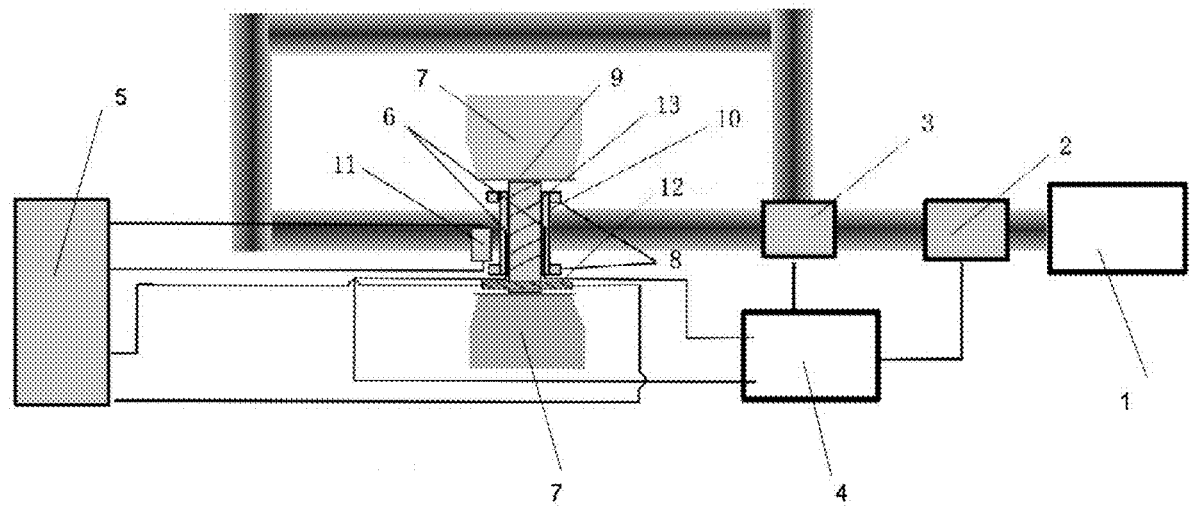
FIG. 1 is a schematic diagram of a device for measuring the magnetism of a permanent magnet material at a high temperature of the present invention.

Numerals in the drawings: 1: laser device; 2: power controller; 3: light beam controller; 4: temperature controller; 5: magnetism measurement unit; 6: temperature sensor; 7: electromagnet pole head; 8: clamp; 9: heat isolation sheet; 10: heat absorbing sheet; 11: magnetic field measurement probe; 12: magnetic induction intensity measurement coil; and 13: sample.

DETAILED DESCRIPTION OF THE EMBODIMENTS

For better understanding of the objects, structures and functions of the present invention, a device and method for measuring the magnetism of a permanent magnet material at a high temperature according to the present invention will be described in detail with reference to the accompanying drawings.

As shown in FIG. 1, a device for measuring the magnetism of a permanent magnet material at high temperature of the present invention includes a laser device 1, a power controller 2, a light beam controller 3, a temperature controller 4, a magnetism measurement unit 5, temperature sensors 6, and electromagnet pole heads 7.

The electromagnet pole heads 7 are divided into an upper piece and a lower piece which are respectively used for clamping upper and lower surfaces of a sample 13. A magnetizing current is made to the electromagnet to magnetize the sample 13. A heat isolation sheet 9 is arranged between each electromagnet pole head 7 and the sample 13 and is used for isolating the electromagnet pole head from the sample 13.

Figure 2:
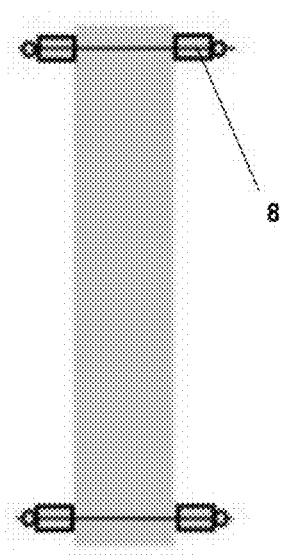
FIG. 2 is a schematic diagram of clamps for a sample.

Heat absorbing sheets 10 are respectively fixed on front and rear surfaces of the sample 13. Each heat absorbing sheet 10 is made of a high-temperature-resistant heat conduction material with a thickness of 1 mm to 5 mm, and preferably a surface of the heat absorbing sheet 10 is coated with a heat absorbing film having a consistent wavelength with that of laser. As shown in FIG. 2, the heat absorbing sheets 10 on the front and rear surfaces of the sample 13 are fixed by clamps 8, or can be fixed on the surfaces of the sample 13 by high-temperature heat conduction glue.

The temperature sensors (6) are arranged inside or on surfaces of the heat absorbing sheets (10) and are used for measuring temperatures of the heat absorbing sheets (10) on the front and rear surfaces of the sample 13.

The magnetism measurement unit 5 is used for recording and calculating the magnetism of the sample 13. The magnetism measurement unit 5 is respectively connected with a magnetic field measurement probe 11 and a magnetic induction intensity measurement coil 12. The magnetic field measurement probe 11 is arranged on a side surface of the sample 13, and the magnetic induction intensity measurement coil 12 is arranged at a bottom of the sample 13.

The laser device 1 emits a laser beam, and the laser beam is divided into two laser beams by the light beam controller 3 to irradiate the front and rear surfaces of the sample to heat the sample 13.

The power controller 2 is an adjustable electric light filter with a light filtering efficiency of 0.1%-100%, preferably an electric light filter rotating wheel. The light beam controller 3 is an adjustable light beam controller composed of a reflector and a light filter, and a reflected light beam is adjustable within 1%-100%. The temperature controller 4 is respectively connected with the light beam controller 3, the power controller 2 and the heat absorbing sheets 10, and adjusts a ratio of light beams of the light beam controller 3 and the power controller 2 irradiating the heat absorbing sheets 10 on the front and rear surfaces of the sample 13, thus adjusting the temperatures of the heat absorbing sheets (10).

When the device for measuring the magnetism of a permanent magnet material at a high temperature is in use, a block permanent magnet having a length, width and height of a, b and c is used as the sample 13, wherein the height c has a value of 5 mm≤c≤20 mm, and the length and the width have values of 5 mm≤a≤10 mm and 5 mm≤b≤10 mm. The sample 13 is magnetized by a magnetizing machine until the sample is saturated. A height of a magnetizing magnetic field is 1 to 5 times the height c of the sample 13.

The two heat absorbing sheets 10 are respectively fixed on the front and rear surfaces of the sample 13.

The sample 13 is arranged between the two electromagnet pole heads 7. The heat isolation sheets 9 are placed between the sample 13 and the two electromagnet pole heads 7. A distance between the electromagnet pole heads 7 is adjusted. The electromagnet pole heads 7 are used to compress the sample 13.

The power of the laser device 1 is 1-100 W. The laser beams are adjusted to irradiate the front and rear surfaces of the sample 13. The temperature sensors 6 on the heat absorbing sheets 10 are used to measure temperatures $T_1$ and $T_2$ of the heat absorbing sheets 10 on the front and rear surfaces of the sample 13 respectively. An operating temperature of the temperature sensor 6 is 0° C.-900° C.

The light beam controller 3 adjusts the ratio of the two laser beams irradiating the front and rear surfaces of the sample 13 so that $T_1=T_2$, and the power controller 2 is adjusted so that $T_1=T_2=T_0$. Temperatures $T_1$ and $T_2$ should be controlled at $T_0\pm2°$ C. The magnetism of the sample 13 is started to be measured after the temperature is stabilized for a period of time. The waiting time is 5 min-60 min, and a temperature range of $T_0$ is 50° C.≤$T_0$≤700° C.

The magnetizing current in the electromagnet is controlled by a direct current source. A magnetizing current is made to the electromagnet such that the sample 13 is magnetized to a saturated state; the magnetizing current is decreased, the direction of the magnetizing current is then changed, and the magnetizing current is increased such that a demagnetization curve passes through a coercive force ($H_{cB}$) point or an intrinsic coercive force ($H_{cj}$) point; the magnetic field measurement probe 11 measures a magnetic field intensity of the electromagnet in the whole process; and the magnetic induction intensity measurement coil 12 measures a magnetic induction intensity of the sample 13 in the whole process.

The magnetism measurement unit 5 records and calculates a demagnetization curve, a maximum BH product, remanence ($B_r$), coercive force ($H_{cB}$) and intrinsic coercive force ($H_{cj}$) of the sample 13 at temperature $T_0$.

Embodiment 1

Figure 3:
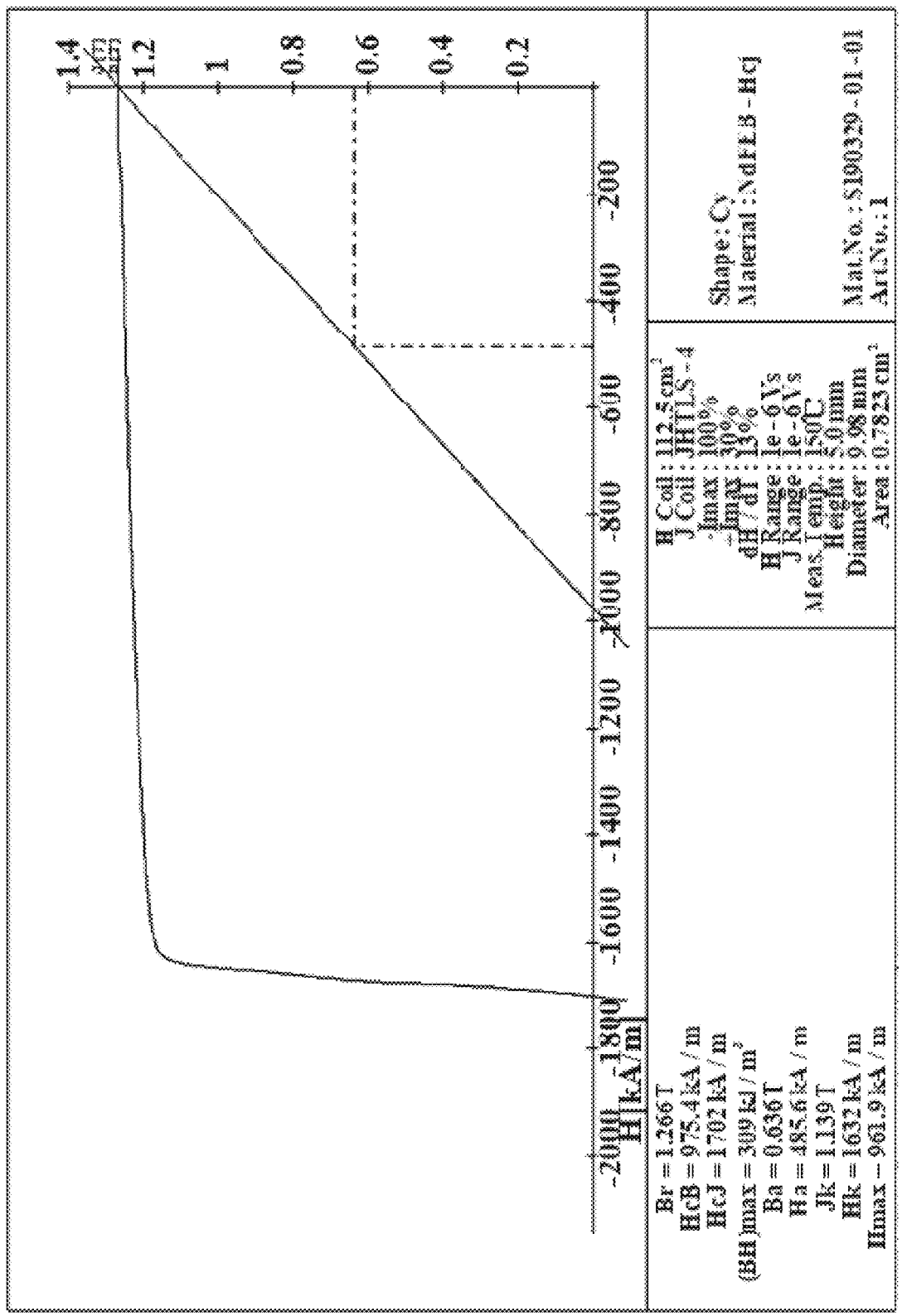
FIG. 3 is a curve graph of magnetic performance of an NdFeB permanent magnet at 22° C.
Figure 4:
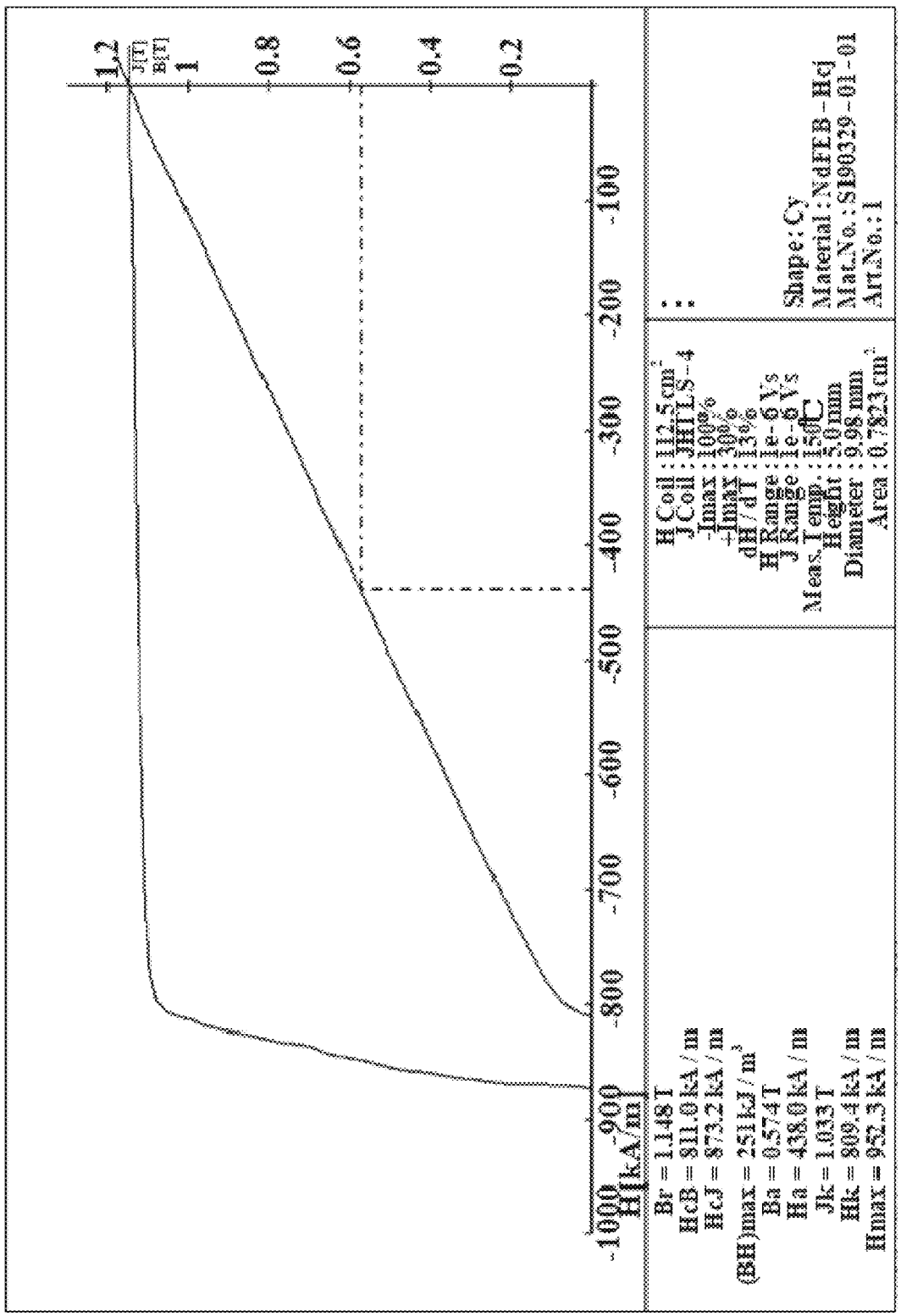
FIG. 4 is a curve graph of magnetic performance of the NdFeB permanent magnet at 100° C.
Figure 5:
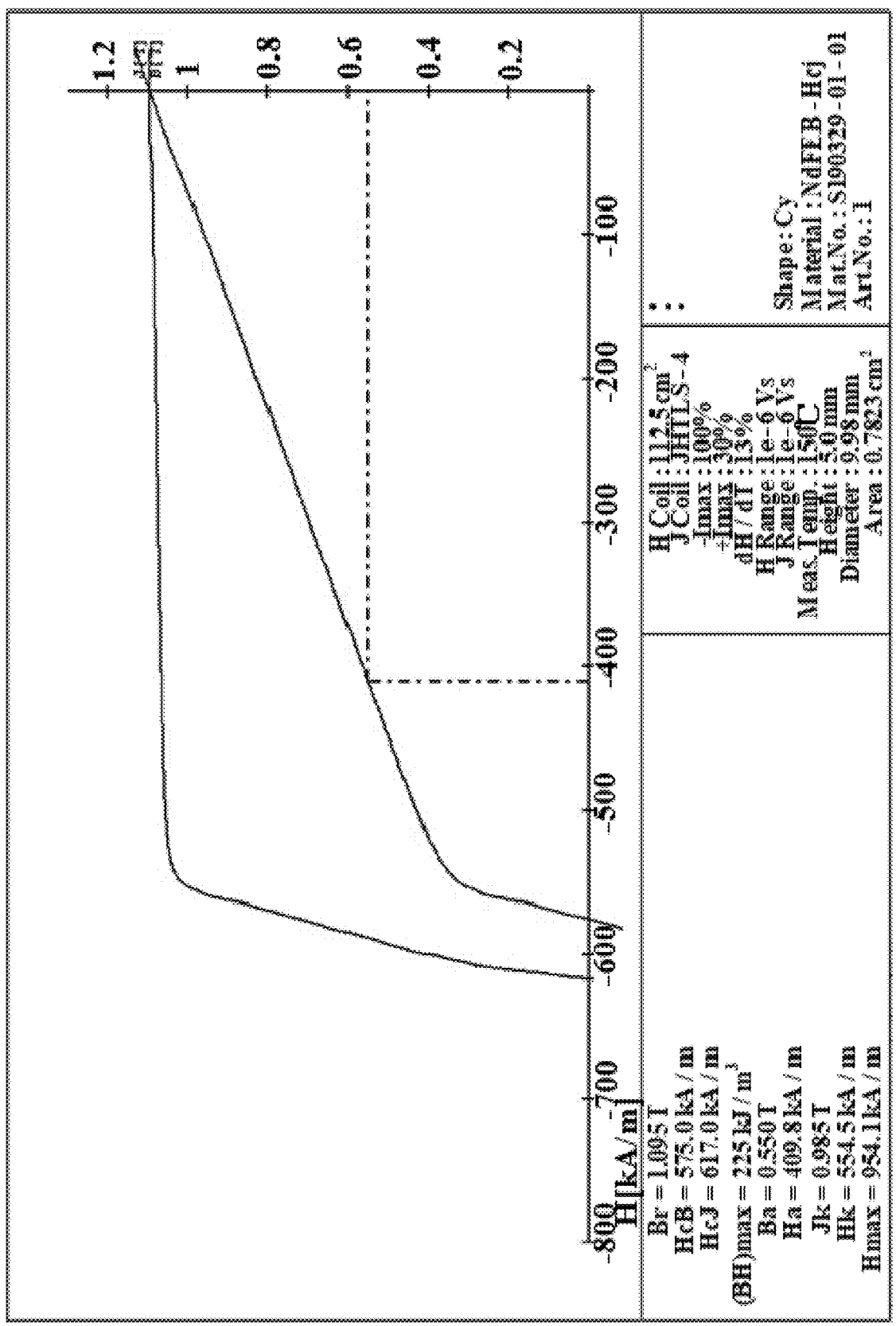
FIG. 5 a curve graph of magnetic performance of the NdFeB permanent magnet at 130° C.
Figure 6:
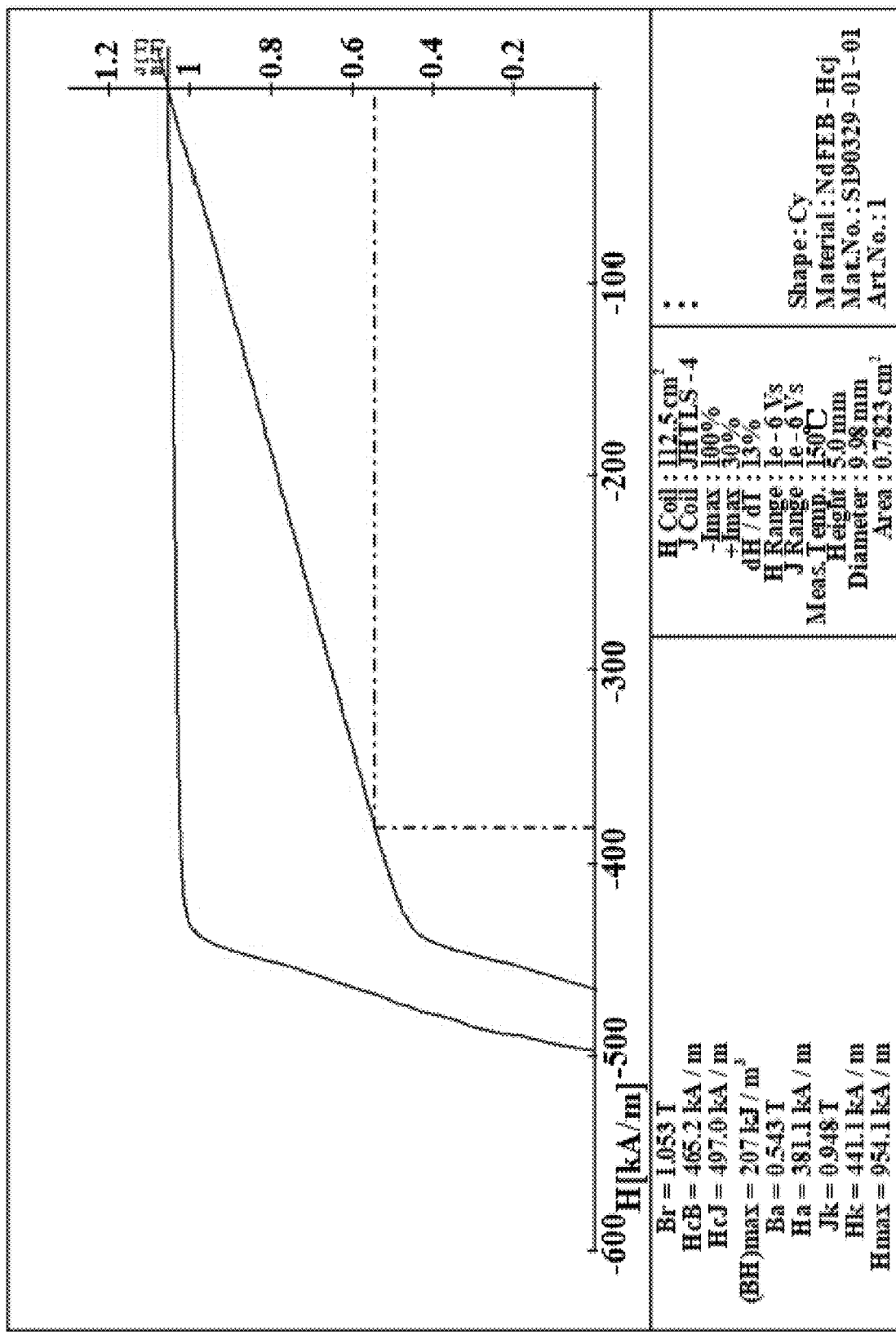
FIG. 6 is a curve graph of magnetic performance of the NdFeB permanent magnet at 150° C.

An NdFeB permanent magnet was used as the sample 13. The magnetic performance of the NdFeB permanent magnet sample 13 at 22° C. (room temperature), 100° C., 130° C. and 150° C. was measured: The sample 13 was first cut into block magnets with a size of 5 mm×5 mm×5 mm. Specific measurement steps were as follows:
 1. The sample 13 was magnetized to be saturated using a magnetizing machine at 9T.
 2. The two heat absorbing sheets 10 were respectively fixed on the front and rear surfaces of the sample 13. The sample 13 was placed between the two electromagnet pole heads 7 by the clamps 8. A distance between the electromagnet pole heads 7 was adjusted. The electromagnet pole heads 7 were used to compress the sample 13.
 3. A femtosecond pulse laser device was preferably used, of which, a wavelength was 800-850 nm and a frequency was 76 MHz. The laser beams were adjusted to irradiate the front and rear surfaces of the sample 13. A diameter of a light spot was 4 mm, and the laser intensity was 50 mW. The temperatures of the front and rear surfaces of the sample 13 were measured, i.e., 24.5° C. and 24.3° C., by using the temperature sensors 6 on the heat absorbing sheets 10.
 4. The light beam controller 3 was adjusted such that the temperatures of the front and rear surfaces of the sample 13 were equal. The temperatures of the front and rear surfaces of the sample 13 after adjustment were 24.4° C. The power controller 2 was roughly adjusted such that the temperatures of the front and rear surfaces of the sample 13 were gradually close to 90° C. The power controller 2 and the light beam controller 3 were finely adjusted such that the temperatures of the surfaces of the sample 13 reached 100° C. Within 15 min, the power controller 2 and the light beam controller 3 were finely adjusted such that the temperatures of the heat absorbing sheets 10 on the sample 13 were maintained at 100° C.
 5. A magnetizing current was made to the electromagnet such that the sample 13 was magnetized to a saturated state; the magnetizing current was decreased, a direction of the magnetizing current was then changed, and the magnetizing current was increased such that a demagnetization curve passed through a coercive force ($H_{cB}$) point or an intrinsic coercive force ($H_{cj}$) point; the magnetic field measurement probe 11 measured a magnetic field intensity of the electromagnet in the whole process; and the magnetic induction intensity measurement coil 12 measured a magnetic induction intensity of the sample 13 in the whole process.
 6. The magnetism measurement unit 5 recorded and calculated a demagnetization curve, a maximum BH product, remanence ($B_r$), coercive force ($H_{cB}$) and intrinsic coercive force ($H_{cj}$) of the sample 13 at 100° C., and a measured magnetic performance curve was as shown in FIG. 4.
 7. Steps 3-6 were repeated to measure the magnetic performance of the sample 13 under the conditions of 130° C. and 150° C. The specific magnetic performance was shown in FIG. 5 and FIG. 6.
 8. The sample 13 was cooled to room temperature without laser heating, and the magnetic performance of the sample 13 at 22° C. was measured directly. Results were shown in FIG. 3.

Embodiment 2

A samarium cobalt permanent magnet was used as the sample 13. The magnetic performance of the samarium cobalt permanent magnet sample 13 at 500° C. was measured: The sample 13 was first cut into block magnets with a size of 5 mm×5 mm×10 mm. Specific measurement steps were as follows:
 1. The sample 13 was magnetized to be saturated using a magnetizing machine at 7T.
 2. The two heat absorbing sheets 10 were respectively fixed on the front and rear surfaces of the sample 13. The sample 13 was placed between the two electromagnet pole heads 7 by the clamps 8. A distance between the electromagnet pole heads 7 was adjusted. The electromagnet pole heads 7 were used to compress the sample 13.

3. A continuous laser device was preferably used. The laser beams were adjusted to irradiate the front and rear surfaces of the sample 13. A diameter of a light spot was 4 mm, and the laser intensity was 100 mW. The temperatures of the front and rear surfaces of the sample 13 were measured, i.e., 27° C. and 32° C., by using the temperature sensors 6 on the heat absorbing sheets 10.

4. The light beam controller 3 was adjusted such that the temperatures of the front and rear surfaces of the sample 13 were equal. The light beam controller 3 was composed of a reflector and a light filter. The temperatures of the front and rear surfaces of the sample 13 after adjustment were 28.3° C. The power controller 2 was roughly adjusted, and an electric light filter rotating wheel was used as the power controller 2, so that the temperatures of the front and rear surfaces of the sample 13 were gradually close to 380° C. The power controller 2 and the light beam controller 3 were finely adjusted such that the temperatures of the surfaces of the sample reached 500° C. Within 30 min, the power controller 2 and the light beam controller 3 were finely adjusted such that the temperatures of the heat absorbing sheets 10 on the sample 13 were maintained at 500° C.

5. A magnetizing current was made to the electromagnet such that the sample 13 was magnetized to a saturated state; the magnetizing current was decreased, the direction of the magnetizing current was then changed, and the magnetizing current was increased such that a demagnetization curve passed through a coercive force ($H_{cB}$) point or an intrinsic coercive force ($H_{cj}$) point; the magnetic field measurement probe 11 measured a magnetic field intensity of the electromagnet in the whole process; and the magnetic induction intensity measurement coil 12 measured a magnetic induction intensity of the sample 13 in the whole process.

Figure 7:
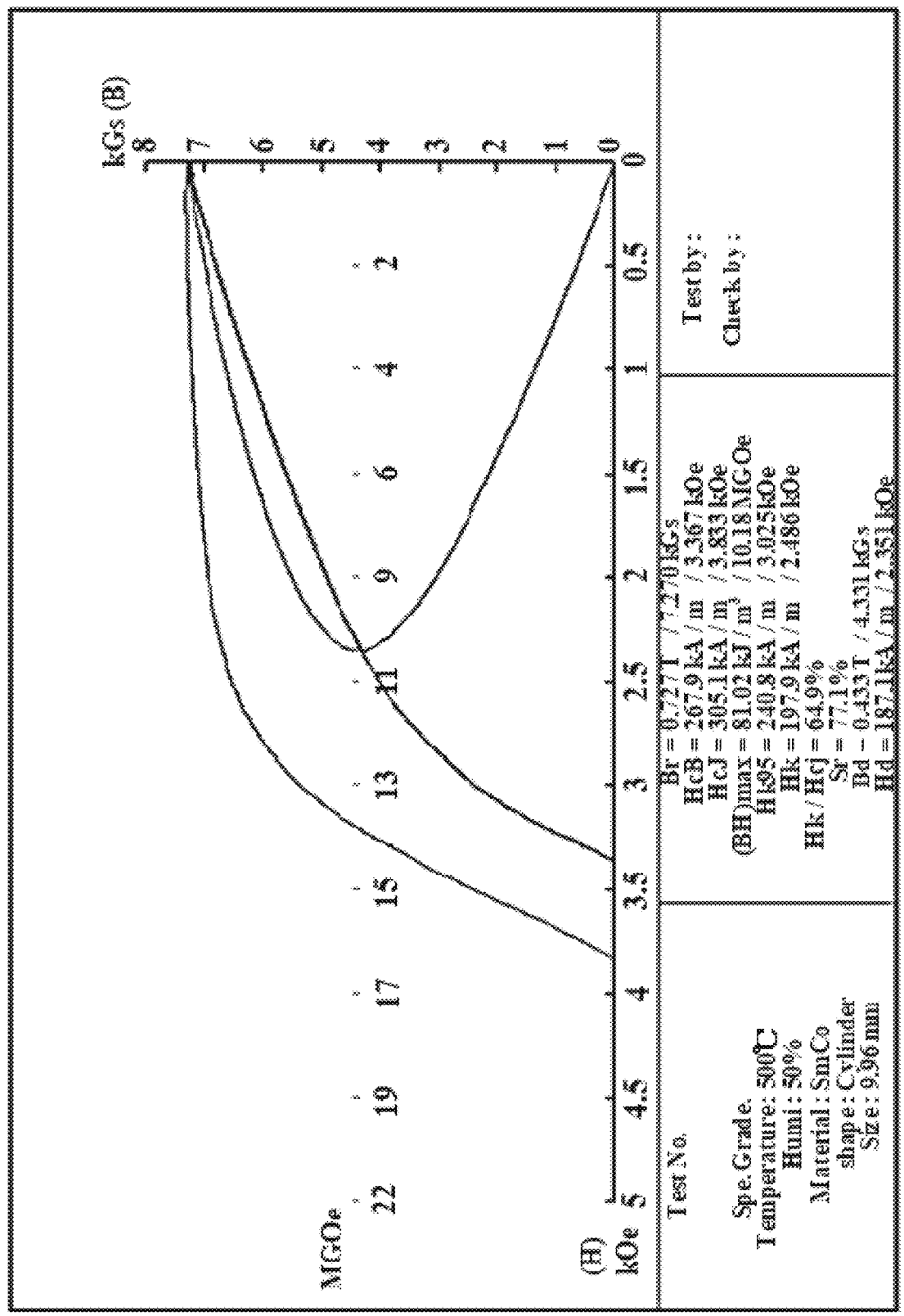
FIG. 7 is a curve graph of magnetic performance of the samarium cobalt permanent magnet at 500° C.

6. The magnetism measurement unit 5 recorded and calculated a demagnetization curve, a maximum BH product, remanence ($B_r$), coercive force ($H_{cB}$) and intrinsic coercive force ($H_{cj}$) of the sample 13 at 500° C., and the magnetic performance was as shown in FIG. 7.

It can be understood that the present invention has been described with reference to certain embodiments. Those skilled in the art know that various changes or equivalent replacements can be made to these features and embodiments without departing from the spirit and scope of the present invention. In addition, modifications may be made, according to the teachings of the present invention, to these features and embodiments to adapt a particular situation or material, without departing from the spirit and scope of the present invention. Therefore, the present invention is not limited to the particular embodiments disclosed. All embodiments falling within the scope of claims of the present application fall within the protection scope of the present invention.

What is claimed is:

1. A device for measuring a magnetism of a permanent magnet material at a high temperature, comprising a laser device, a power controller, a light beam controller, a temperature controller, a magnetism measurement unit, temperature sensors, and electromagnet pole heads, wherein the electromagnet pole heads are divided into an upper piece and a lower piece, wherein the upper piece clamps an upper surface of a sample and the lower piece clamps a lower surface of the sample; heat absorbing sheets are respectively fixed on a front surface and a rear surface of the sample;
wherein the temperature sensors are arranged on the heat absorbing sheets and measure temperatures of the heat absorbing sheets;
wherein the magnetism measurement unit is respectively connected with a magnetic field measurement probe and a magnetic induction intensity measurement coil and the magnetism measurement unit records and calculates a magnetism of the sample,
wherein the magnetic field measurement probe is arranged on a side surface of the sample, and the magnetic induction intensity measurement coil is arranged at a bottom of the sample;
wherein the laser device emits a laser beam, and the laser beam is divided into two laser beams by the light beam controller to irradiate the front surface and the rear surface of the sample, to heat the sample; and wherein
the temperature controller is respectively connected with the light beam controller, the power controller and the heat absorbing sheets, and the temperature controller adjusts a ratio of light beams of the light beam controller and light beams of the power controller irradiating the heat absorbing sheets on the front surface and the rear surface of the sample, thus adjusting the temperatures of the heat absorbing sheets;
wherein each of the heat absorbing sheets is made of a high-temperature-resistant heat conduction material with a thickness of 1 mm to 5 mm, and a surface of each of the heat absorbing sheets is coated with a heat absorbing film having a wavelength consistent with a wavelength of the laser; and the heat absorbing sheets are fixed on the front surface and the rear surface of the sample by clamps; and a heat isolation sheet is arranged between each of the electromagnet pole heads and the sample.

2. The device for measuring the magnetism of the permanent magnet material at the high temperature according to claim 1, wherein the heat absorbing sheets are fixed on the front surface and the rear surface of the sample through high-temperature heat conduction glue.

3. The device for measuring the magnetism of the permanent magnet material at the high temperature according to claim 1, wherein the power controller is an adjustable electric light filter with a light filtering efficiency of 0.1%-100%, and the power controller is an electric light filter rotating wheel; the light beam controller is an adjustable light beam controller composed of a reflector and a light filter, and a reflected light beam is adjustable within 1%-100%; each of the temperature sensors has an operating temperature of 0° C.-900° C., and the temperature sensors are arranged inside or on the front surface or the rear surface of the heat absorbing sheets.

4. The device for measuring the magnetism of the permanent magnet material at the high temperature according to claim 1, wherein the sample has a length, a width and a height of a, b and c respectively, wherein the height c has a value of 5 mm≤c≤20 mm; and the length and the width have values of 5 mm≤a≤10 mm and 5 mm≤b≤10 mm respectively.

5. A method for measuring a magnetism of a permanent magnet material using the device for measuring the magnetism of the permanent magnet material at the high temperature according to claim 1, comprising the following steps:

step I: magnetizing a square block permanent magnet sample to a saturated state;

step II: respectively fixing two heat absorbing sheets on a front surface and a rear surface of the square block permanent magnet sample and placing the square block permanent magnet sample between two electromagnet pole heads, and adjusting a distance between the electromagnet pole heads to enable the two electromagnet pole heads to compress the square block permanent magnet sample;

step III: emitting, by the laser device, a laser beam, wherein the laser beam is divided into two laser beams through the power controller and the light beam controller, wherein the two laser beams irradiate the heat absorbing sheets on the front surface and the rear surface of the square block permanent magnet sample, and measuring and obtaining temperatures $T_1$ and $T_2$ of each of the heat absorbing sheets on the front surface and the rear surface of the square block permanent magnet sample through temperature sensors on the heat absorbing sheets;

step IV: using the temperature controller to adjust, according to the temperatures of each of the heat absorbing sheets obtained in step III, the power controller and the light beam controller to enable the temperatures $T_1$ and $T_2$ of each of the heat absorbing sheets to gradually approach a temperature $T_0$, to finally achieve $T_1=T_2=T_0$, wherein the temperature controller measures the magnetism of the square block permanent magnet sample after the temperature is stabilized for a period of time;

step V: making a magnetizing current to the electromagnet and magnetizing the square block permanent magnet sample to a saturated state; decreasing the magnetizing current, changing a direction of the magnetizing current, increasing the magnetizing current until a demagnetization curve passes through a coercive force point or an intrinsic coercive force point, and measuring, by the magnetic field measurement probe, a magnetic field intensity of the electromagnet in a whole process, and measuring, by the magnetic induction intensity measurement coil, a magnetic induction intensity of the square block permanent magnet sample in the whole process; and step VI: recording and calculating, by the magnetism measurement unit, a demagnetization curve, a maximum BH product, a remanence, a coercive force and an intrinsic coercive force of the square block permanent magnet sample at temperature $T_0$.

6. The method for measuring the magnetism of the permanent magnet material according to claim 5, wherein the laser device in step III is a femtosecond pulse laser device or a continuous laser device.

7. The method for measuring the magnetism of the permanent magnet material according to claim 5, wherein $T_1$ and $T_2$ in step IV are controlled to be $T_0 \pm 2°$ C., a temperature range of $T_0$ is $50°$ C.$\leq T_0 \leq 700°$ C., and a period of time is 15 min to 60 min.

8. The method according to claim 5, wherein in the device, the heat absorbing sheets are fixed on the front surface and the rear surface of the sample through high-temperature heat conduction glue.

9. The method according to claim 5, wherein in the device, the power controller is an adjustable electric light filter with a light filtering efficiency of 0.1%-100%, and the power controller is an electric light filter rotating wheel; the light beam controller is an adjustable light beam controller composed of a reflector and a light filter, and a reflected light beam is adjustable within 1%-100%; each of the temperature sensors has an operating temperature of $0°$ C.-$900°$ C., and the temperature sensors are arranged inside or on the front surface or the rear surface of the heat absorbing sheets.

10. The method according to claim 5, wherein in the device, the sample has a length, a width and a height of a, b and c respectively, wherein the height c has a value of 5 mm$\leq$c$\leq$20 mm; and the length and the width have values of 5 mm$\leq$a$\leq$10 mm and 5 mm$\leq$b$\leq$10 mm respectively.

\* \* \* \* \*